(12) United States Patent
Kesselring et al.

(10) Patent No.: US 8,994,460 B2
(45) Date of Patent: Mar. 31, 2015

(54) IMPLEMENTING COMPACT CURRENT MODE LOGIC (CML) INDUCTOR CAPACITOR (LC) VOLTAGE CONTROLLED OSCILLATOR (VCO) FOR HIGH-SPEED DATA COMMUNICATIONS

(71) Applicant: International Business Machines Corporation, Armonk, NY (US)

(72) Inventors: Grant P. Kesselring, Rochester, MN (US); James D. Strom, Rochester, MN (US); Kenneth A. Van Goor, Fall Creek, WI (US); Kennedy K. Cheruiyot, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 310 days.

(21) Appl. No.: 13/675,650

(22) Filed: Nov. 13, 2012

(65) Prior Publication Data

US 2014/0132321 A1 May 15, 2014

(51) Int. Cl.
*H03L 7/00* (2006.01)
*H03L 7/099* (2006.01)

(52) U.S. Cl.
CPC .................................. *H03L 7/0992* (2013.01)
USPC ................ 331/17; 331/1 A; 331/16; 331/185; 331/186

(58) Field of Classification Search
USPC .......... 331/1 A, 16, 17, 117 R, 167, 182, 185, 331/186; 327/156–159
See application file for complete search history.

(56) References Cited

U.S. PATENT DOCUMENTS

| | | | | |
|---|---|---|---|---|
| 6,127,880 A | * | 10/2000 | Holst et al. | 327/531 |
| 6,943,636 B2 | * | 9/2005 | Moore | 331/117 FE |
| 7,498,888 B2 | * | 3/2009 | Nitsche et al. | 331/17 |
| 7,667,545 B2 | * | 2/2010 | Schlueter et al. | 331/14 |
| 2003/0076177 A1 | * | 4/2003 | Fischer | 331/17 |
| 2010/0277245 A1 | * | 11/2010 | Liu | 331/34 |

\* cited by examiner

*Primary Examiner* — Joseph Chang
*Assistant Examiner* — Jeffrey Shin
(74) *Attorney, Agent, or Firm* — Joan Pennington

(57) ABSTRACT

A method and a phase locked loop (PLL) circuit for implementing compact current mode logic inductor capacitor voltage controlled oscillator for high speed communications, and a design structure on which the subject circuit resides are provided. The PLL circuit includes a current mode logic (CML) inductor capacitor (LC) Voltage Controlled Oscillator (VCO). The PLL circuit includes a reference circuit generates a virtual ground node for biasing noise sensitive components, providing level shifted VCO increment and decrement tuning values from a phase detector coupled by a respective resistor to tune a varactor of the LC VCO, and providing a loop filter function. The virtual ground node tracks a logic power supply noise, incurring no jitter penalty, and eliminating the need for a separate power supply for the PLL circuit.

20 Claims, 8 Drawing Sheets

US 8,994,460 B2

IMPLEMENTING COMPACT CURRENT MODE LOGIC (CML) INDUCTOR CAPACITOR (LC) VOLTAGE CONTROLLED OSCILLATOR (VCO) FOR HIGH-SPEED DATA COMMUNICATIONS

FIELD OF THE INVENTION

The present invention relates generally to the data processing field, and more particularly, relates to a method and a phase locked loop (PLL) circuit for implementing compact current mode logic inductor capacitor voltage controlled oscillator for high speed communications, and a design structure on which the subject circuit resides.

DESCRIPTION OF THE RELATED ART

Phase locked loop (PLL) circuits are widely used in many different applications. PLL circuits often include an inductor capacitor (LC) Voltage Controlled Oscillator (VCO) for high speed data communications such as (SERDES) Serializer/Deserializer.

SERDES requires LC VCO PLLs for low phase jitter and low phase noise oscillators. Significant disadvantages of LC VCO PLLs are the circuit area required, and power supply requirements including the need for at least one additional voltage supply voltage.

Such conventional LC VCO PLLs are large including, for example, bandgap with two regulators, 2-5 nF of decoupling, 100 pF, EG charge pump loop filter requiring that the conventional LC VCO PLL must be located away from the core logic for high speed data communications with the clock distribution to the LC VCP PLL having significant power.

SUMMARY OF THE INVENTION

Principal aspects of the present invention are to provide a method and a phase locked loop (PLL) circuit for implementing a compact current mode logic inductor capacitor voltage controlled oscillator for high speed communications, and a design structure on which the subject circuit resides. Other important aspects of the present invention are to provide such method and circuit substantially without negative effects and that overcome some disadvantages of prior art arrangements.

In brief, a method and a phase locked loop (PLL) circuit for implementing a compact current mode logic inductor capacitor voltage controlled oscillator for high speed communications, and a design structure on which the subject circuit resides are provided. The PLL circuit includes a current mode logic (CML) inductor capacitor (LC) Voltage Controlled Oscillator (VCO). The PLL circuit includes a reference circuit generates a virtual ground node for biasing noise sensitive components, providing level shifted VCO increment and decrement tuning values from a phase detector coupled by a respective resistor to tune a varactor of the LC VCO, and providing a loop filter function. The virtual ground node tracks a logic power supply noise, incurring no jitter penalty, and eliminating the need for a separate power supply for the PLL circuit.

In accordance with features of the invention, the CML LC VCO of the PLL circuit includes a compact area and significantly reduced complexity required for a conventional LC PLL.

In accordance with features of the invention, the reference circuit generating the virtual ground node includes a small decoupling capacitor, such as 5 pico-farad (pF) connected between the virtual ground node and logic power supply rail.

In accordance with features of the invention, the reference circuit generating the virtual ground node includes a series connected pair of field effect transistors coupled between a logic power supply rail and the virtual ground node, and a current source to a virtual regulator reference.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing an enhanced current mode logic (CML) inductor capacitor (LC) Voltage Controlled Oscillator (VCO) phase locked loop (PLL), and a design structure on which the subject circuits resides are provided. The circuit generates a virtual ground, and signals that are used to control the CML LC VCO are level shifted from the logic power to the virtual ground. The virtual ground node tracks a logic power supply noise, incurring no jitter penalty, and eliminating the need for a separate power supply for the PLL circuit.

Figure 1:
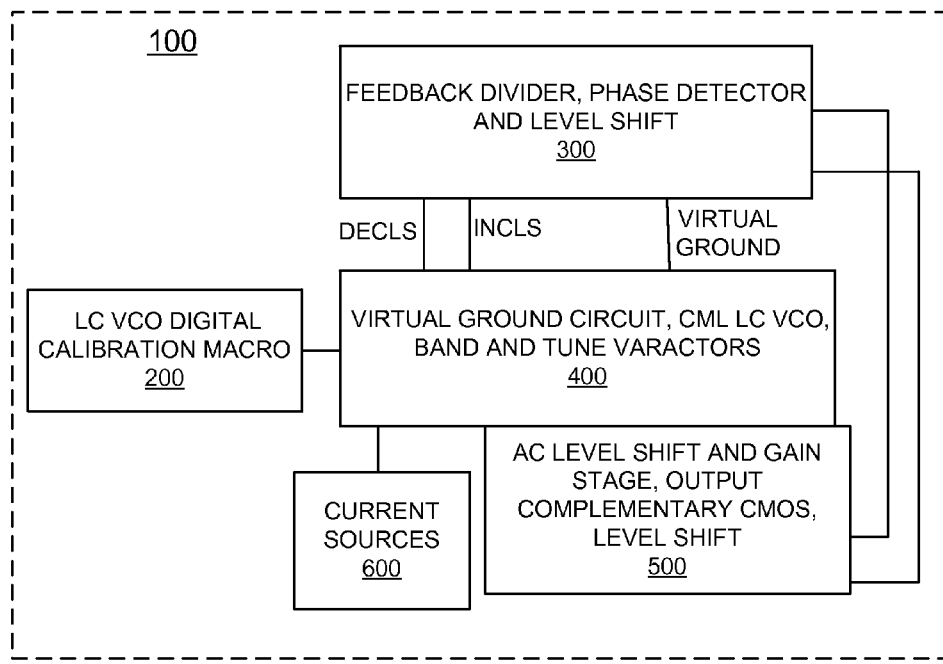
FIG. 1 provides a block diagram representation of example component functions of a phase locked loop (PLL) circuit implementing an enhanced current mode logic (CML) inductor capacitor (LC) Voltage Controlled Oscillator (VCO) in accordance with the preferred embodiment.

Having reference now to the drawings, in FIG. 1, there is shown a plurality of example component functions of a phase locked loop (PLL) circuit implementing an enhanced current mode logic (CML) inductor capacitor (LC) Voltage Controlled Oscillator (VCO) in accordance with a preferred embodiment generally designated by the reference character 100.

In FIGS. 2, 3, 4A, 4B, 5 and 6, there are shown example component functions of the phase locked loop (PLL) circuit 100. PLL circuit 100 includes an LC VCO digital calibration macro generally designated by the reference character 200 as illustrated and described with respect to FIG. 2. PLL circuit 100 includes a feedback divider, phase detector and level shift generally designated by the reference character 300 as illustrated and described with respect to FIG. 3. PLL circuit 100 includes an example virtual ground circuit, CMLLC VCO, band varactors, and tune varactors generally designated by the reference character 400 as illustrated and described with respect to FIGS. 4A, 4B. PLL circuit 100 includes an AC level shift and gain stage, output complementary CMOS and output level shift generally designated by the reference character 500 as illustrated and described with respect to FIG. 5. PLL circuit 100 includes a plurality of current sources designated by the reference character 600 as illustrated and described with respect to FIG. 6.

In accordance with features of the invention, PLL circuit 100 eliminates the need for a large regulator with a typical large area used for decoupling capacitance, enabling a compact chip area for the PLL circuit.

Figure 2:
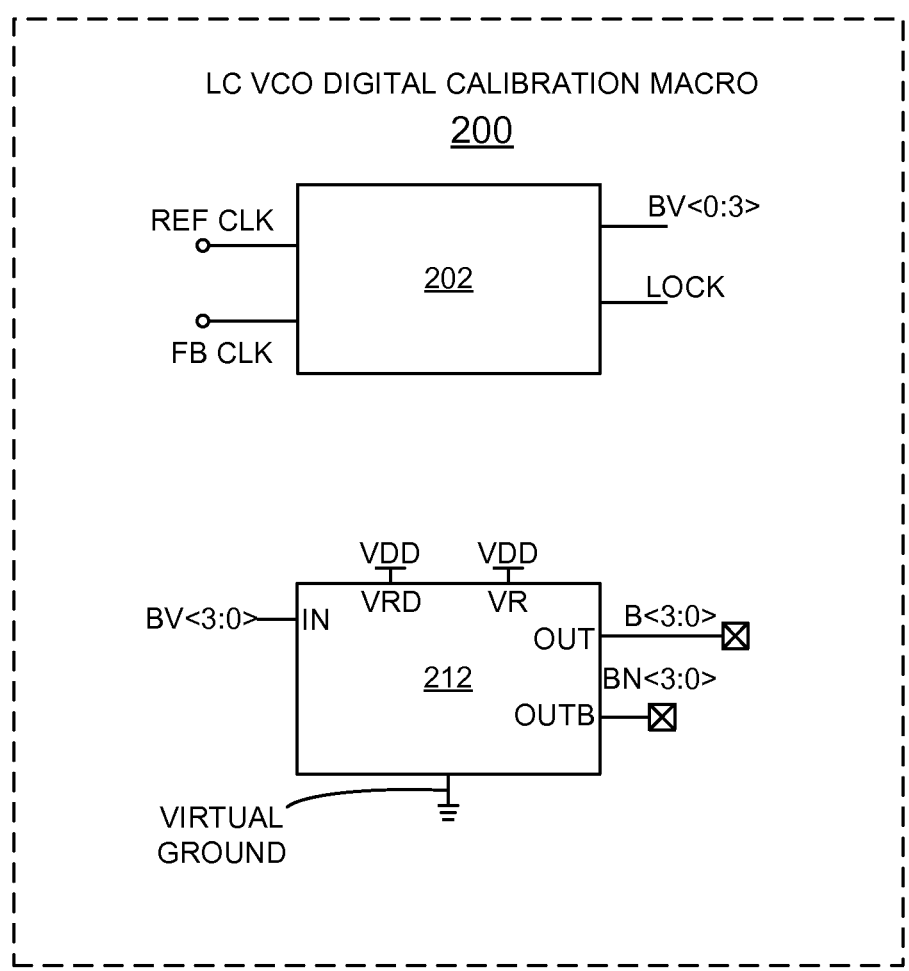
FIGS. 2, 3, 4A, 4B, 5, and 6 are schematic and block diagram representations of the example component functions forming the phase locked loop (PLL) circuit of FIG. 1 in accordance with the preferred embodiment.

Referring to FIG. 2, there is shown an example LC VCO digital calibration macro generally designated by the reference character 200 of the PLL circuit 100 in accordance with the preferred embodiment. LC calibration function 200 includes a digital calibration macro 202 providing calibration band bits BV<3:0>, a lock signal LOCK, and including a reference clock (REF CLK), and a feedback clock (FB CLK).

LC VCO digital calibration macro 200 includes a digital calibration macro 212 receiving calibration band bits BV<3:0> and providing a level shifted calibration function with output varactor calibration band bits B<3:0> and BN<3:0> biased between the logic power supply VDD and virtual ground. The varactor calibration band bits B<3:0> are applied to band varactors 436 of FIG. 4B of the CML LC VCO. The LC VCO digital calibration macro 200 calibrates a center frequency of the CMLLC VCO at power on.

Figure 3:
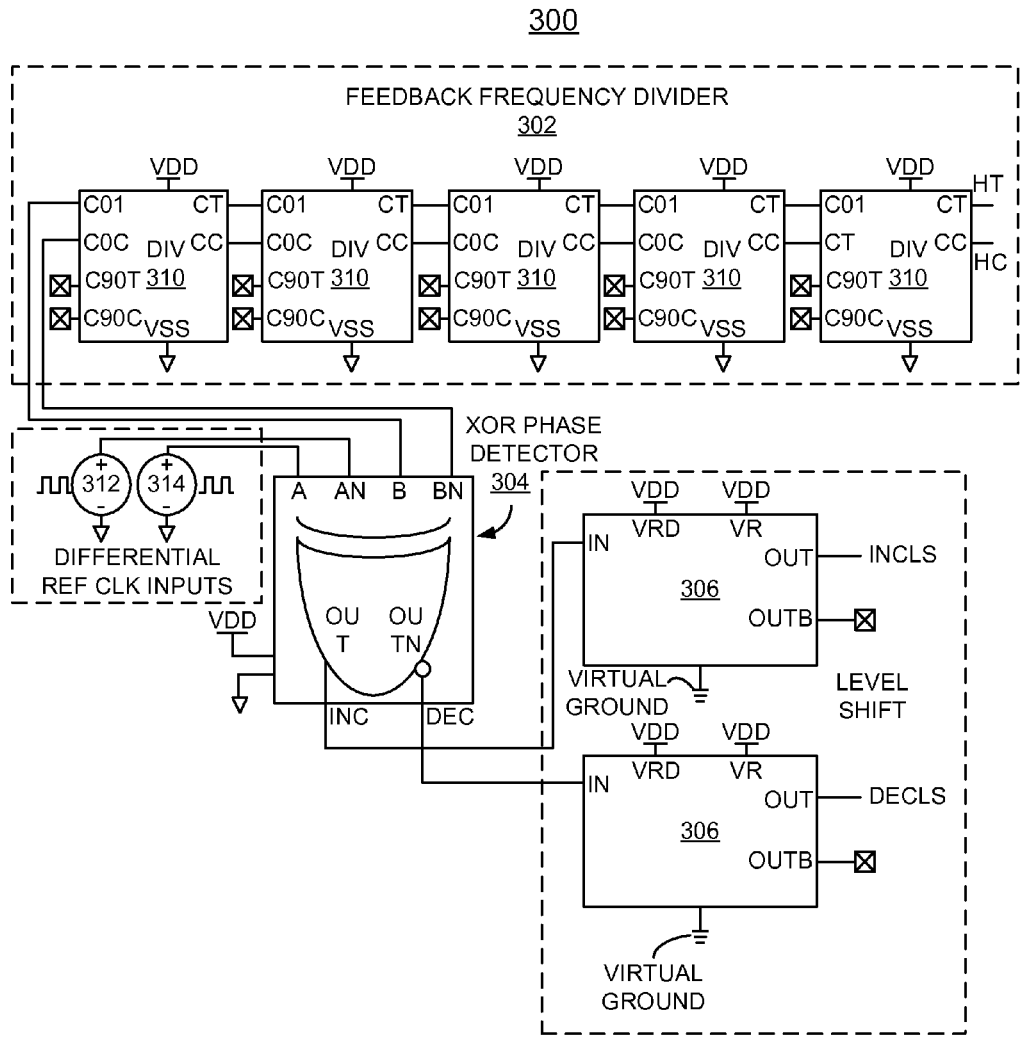
Figure 5:
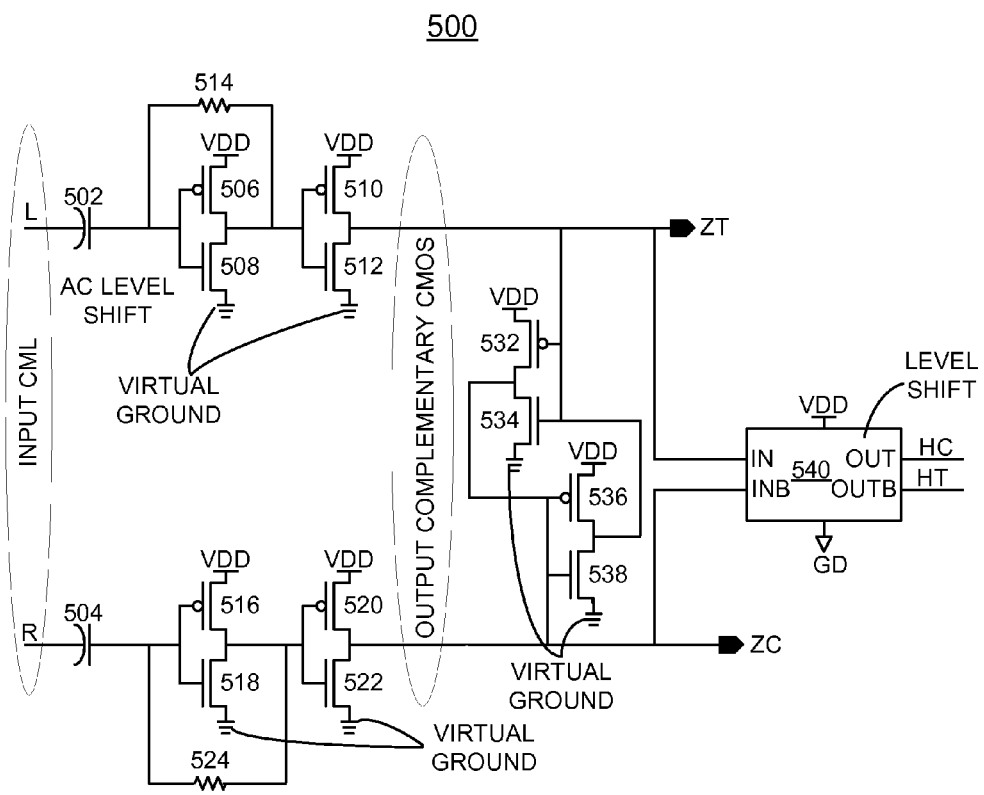

Referring now to FIG. 3, the component functions 300 include a feedback divider 302, a phase detector 304 and a level shift 306 in accordance with the preferred embodiment. The feedback divider 302 receiving a VCO oscillation signal from an output of CMLLC VCO, for example, as shown in FIG. 5 and includes a plurality of cascaded dividers 310, such as cascaded divide by 2 dividers 310 providing a divide by 32, divided down feedback frequency signal applied to the phase detector 304. It should be understood that other types of divider can be used.

The phase detector 304 optionally is a quadrature XOR phase detector, while it should be understood that other types of phase detector can be used. The XOR phase detector 308 receives differential reference clock inputs 312, 314 from clock buffer at inputs A and AN, and the FeedBack (FB) frequency from the frequency divider 302 at inputs B, BN. The XOR phase detector 308 outputs a balanced charge Up and Down (INC/DEC) digital signals that are 90° out of phase when the reference frequency (REF CLK) matches that of the FeedBack (FB) frequency. The Up and Down (INC/DEC) signals are level shifted by the level shift 306 to the level shifted virtual ground increment and decrement signals INCLS, DECLS that feed the tune varactors 454 directly through resistors 456, 457 as shown in FIG. 4B tuning the CMLLC VCO and providing loop filtering of the PLL circuit 100, such as shown in FIG. 5 for the example CMLLC VCO PLL loop filter function 500. When the divided down frequency of the CMLLC VCO matches that of the reference clock, the net charge on to the tuning varactors 454 is zero and the frequency of the CMLLC VCO holds at its desired value.

Figure 4A:
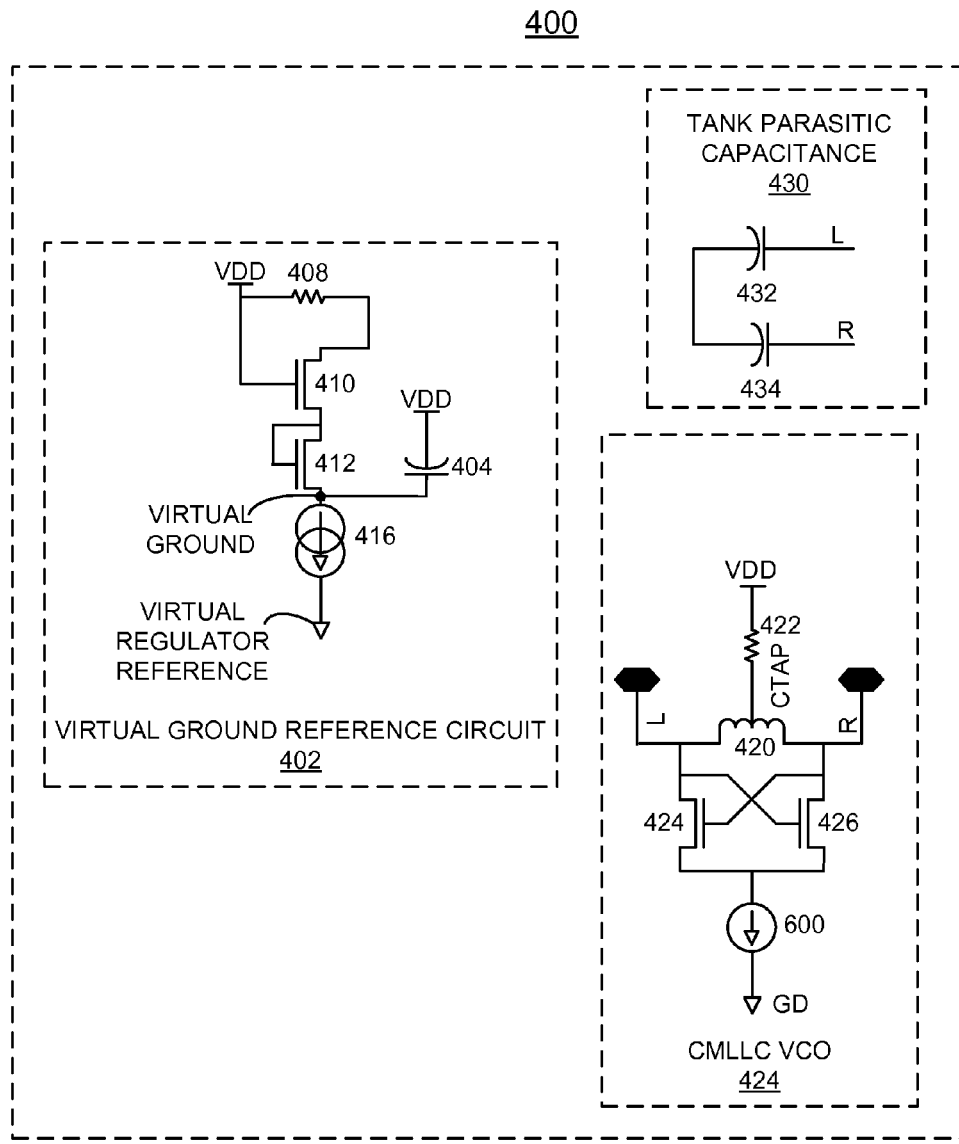
Figure 4B:
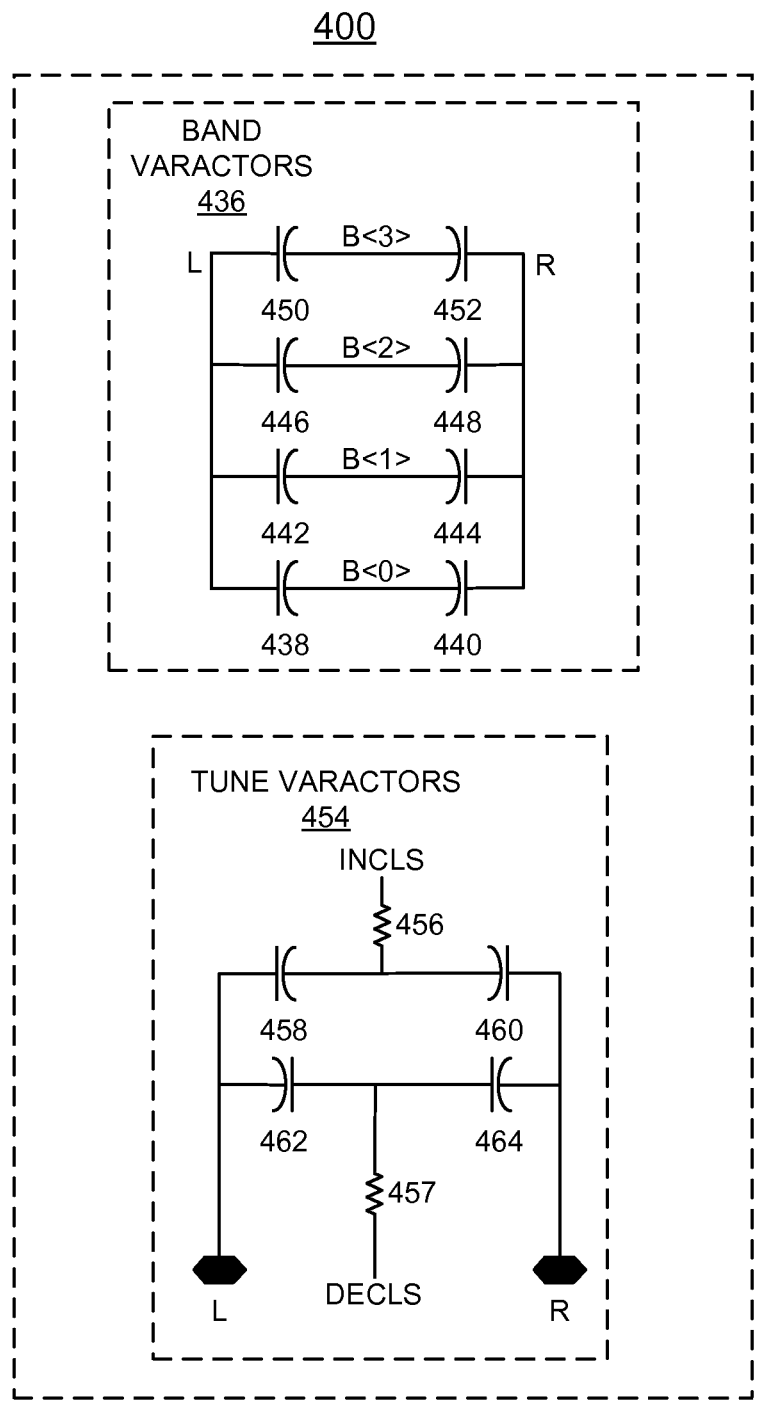

Referring now to FIGS. 4A and 4B, there are shown example virtual ground reference circuit, CMLLC VCO components including band varactors, and tune varactors generally designated by the reference character 400.

In FIG. 4A, there is shown an example virtual ground reference circuit generally designated by the reference character 402. The virtual ground reference circuit 402 generating the virtual ground node labeled VIRTUAL GROUND includes a small decoupling capacitor 404, such as 5 picofarad (pF) connected between the virtual ground node and logic power supply rail VDD. The virtual ground reference circuit 402 includes a series connected pair of field effect transistors 410, 412 coupled by a resistor 414 to logic power supply rail VDD and connected to the virtual ground node and a current source 416 connected to a virtual regulator reference.

In FIG. 4A, there is shown an example CMLLC VCO component function generally designated by the reference character 424. CMLLC VCO component function 424 include a center tap inductor 420 optionally with a resistor 422 connected between a center tap inductor connection and the logic power supply rail VDD. A cross coupled differential pair of field effect transistors 424, 426 are coupled between opposed nodes or connections labeled L, R to the inductor 420 and a current source 600 connected to the logic power supply rail ground. An example current source 600 is illustrated and described with respect to FIG. 6. In FIG. 4A, there is shown an example tank parasitic capacitance generally designated by the reference character 430 including a pair of capacitors 432, 434 connected between nodes L, R connections to the inductor 420.

In FIG. 4B, there are shown example band varactors generally designated by the reference character 436 including respective pairs of series connected voltage-controlled capacitance varactors 438, 440; 442, 444; 446, 448; and 450, 452 connected to the nodes L, R connections to the inductor 420 of the CMLLC VCO circuit components 424 in FIG. 4A. Each respective pair of series connected voltage-controlled capacitance varactors 438, 440; 442, 444; 446, 448; and 450, 452 receives a respective varactor calibration band input of bits B<3:0>, as shown.

In FIG. 4B, there are shown example tune varactors generally designated by the reference character 454 including respective level shifted virtual ground increment and decrement signals INCLS, DECLS applied directly through resistors 456, 457 to respective pairs of series connected voltage-controlled capacitance varactors 458, 460, and 462, 464. The series connected pairs of voltage-controlled capacitance varactors 458, 460, and 462, 464 are connected to the nodes L, R connections to the inductor 420 of the CMLLC VCO circuit components 424 in FIG. 4A.

Referring now to FIG. 5, there is shown an example AC level shift and gain stage with output complementary CMOS output level shift generally designated by the reference character 500. The voltage swing of the oscillator signal output from the nodes L, R connections of the CMLLC VCO circuit function 424 in FIG. 4A is coupled by a respective capacitor 502, 504 and level shifted with an AC level shift 500 from the logic level LC tank voltage ground GD to the virtual ground and VDD. The AC level shift and gain stage 500 includes a respective first series connected pair of a P-channel field effect transistor (PFET) 506 and an N-channel field effect transistor (NFET) 508 and a second series connected pair of PFET 510 and NFET 512 connected between the logic power supply rail VDD and the virtual ground. A resistor 514 is connected between a common gate connection of the first series connected PFET 506 and NFET 508 and a common gate connection of the second series connected PFET 510 and NFET 512, and the capacitor 502 of the path ZT.

The AC level shift and gain stage 500 similarly includes a first series connected pair of a PFET 516 and an NFET 518 and second series connected pair of PFET 520 and NFET 522 connected between the logic power supply rail VDD and the virtual ground with a resistor 524 connected between a common gate connection of the first series connected PFET 516 and an NFET 518 and a common gate connection of the second series connected PFET 520 and NFET 522, and the capacitor 504 of the path ZC.

An output complementary CMOS connection between the respective paths ZT, ZC includes a first series connected pair of a PFET 532 and an NFET 534 and a second series connected pair of PFET 536 and NFET 538 connected between the logic power supply rail VDD and the virtual ground. A common gate connection of the first series connected PFET 532 and an NFET 534 is connected to the path connection node ZT and a connection between the PFET 536 and NFET 538. A common gate connection of the second series connected PFET 536 and NFET 538 is connected to the path connection node ZC and a connection between the series connected PFET 532 and an NFET 534. Then a simple fast level shifter 540 is used to shift the virtual ground shifted signal back to VDD and the logic power supply ground GD, applying outputs at nodes HC, HT to the feedback frequency divider 302 which divides the VCO oscillation signal by 32 and applies to the divided feedback signal to the XOR (quadrature) phase detector 304 of FIG. 3.

Figure 6:
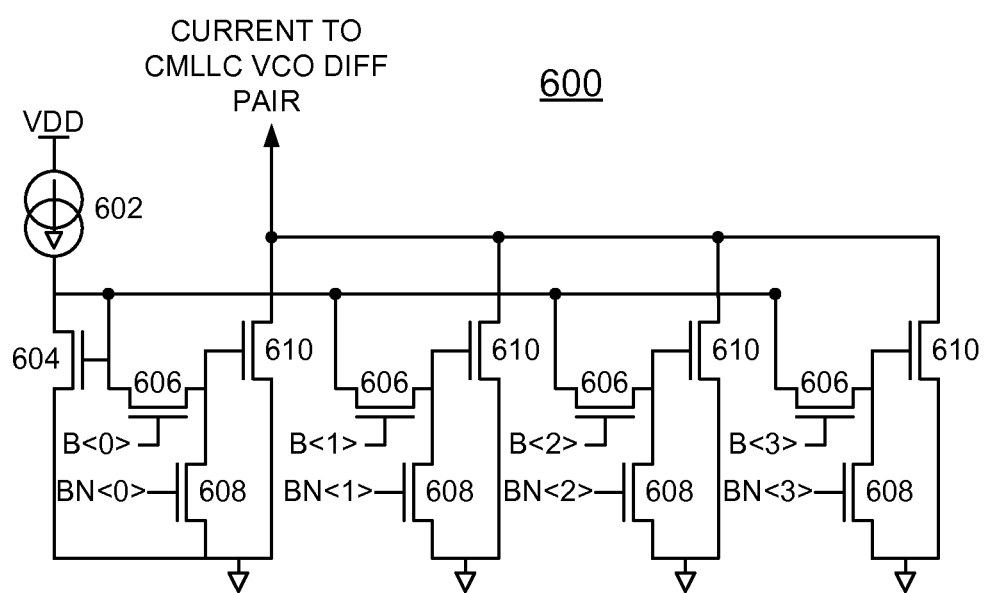

Referring now to FIG. 6, there is shown an example current source generally designated by the reference character 600 for the CMLLC VCO component function 424 of FIG. 4A. The current source 600 includes a reference current source 602 connected to the logic power supply rail VDD and an NFET 604 connected to the logic power supply rail ground. The current source 600 includes a plurality of current sources connected to the CMLLC VCO differential pair of NFETS 424, 426 of FIG. 4A. Each of the plurality of current sources of current source 600 includes a pair of series connected NFETs 608, 608 connected between the reference current source 602 and the logic power supply rail ground. The series connected NFETs 608, 608 respectively receiving a gate input of varactors band bit inputs B0, B1, B2, B3 and BN0, BN1, BN2, BN3 are connected to a gate input of an NFET 610 providing current to the CMLLC VCO differential pair of NFETS 424, 426 of FIG. 4A. The varactors band bit inputs B0, B1, B2, B3 and BN0, BN1, BN2, BN3 are provided by the digital calibration macro 212 of FIG. 2. The current source 600 provides current to the CMLLC VCO differential pair NFETS 424, 426 proportional to the capacitance in the band varactors 436 of FIG. 4B.

Figure 7:
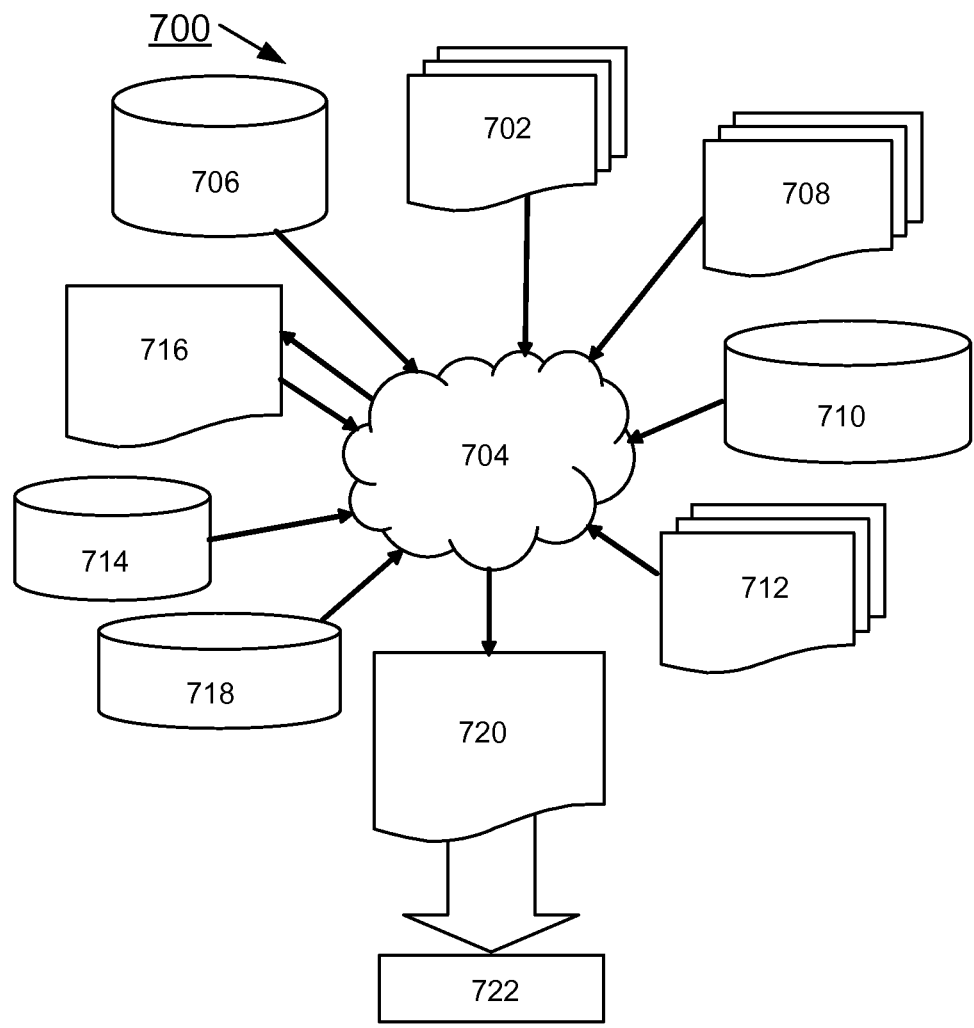
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuit 100 in the form of schematics or HDL, a hardware-description language, for example, Verilog, VHDL, C, and the like. Design structure 702 may be contained on one or more machine readable medium. For example, design structure 702 may be a text file or a graphical representation of circuit 100. Design process 704 preferably synthesizes, or translates, circuit 100 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuits.

Design process 704 may include using a variety of inputs; for example, inputs from library elements 707 which may house a set of commonly used elements, circuits, and devices, including models, layouts, and symbolic representations, for a given manufacturing technology, such as different technology nodes, 72 nm, 45 nm, 90 nm, and the like, design specifications 710, characterization data 712, verification data 714, design rules 716, and test data files 717, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIGS. 1, 2, 3, 4A, 4B, 5, and 6 along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, 3, 4A, 4B, 5, and 6. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing a compact current mode logic inductor capacitor voltage controlled oscillator for high speed communications comprising:

providing a PLL circuit including a current mode logic (CML) inductor capacitor (LC) Voltage Controlled Oscillator (VCO);

providing a reference circuit generating a virtual ground node for biasing noise sensitive components using a logic power supply, said virtual ground node tracking logic power supply noise, incurring no jitter penalty; and using said virtual ground node for providing level shifted VCO increment and decrement tuning values from a phase detector for tuning said CML LC VCO, and providing a loop filter function.

2. The method as recited in claim 1 wherein providing the PLL circuit including a reference circuit generating a virtual ground node for biasing noise sensitive components includes providing the reference circuit generating the virtual ground node including a decoupling capacitor connected between the virtual ground node and logic power supply rail.

3. The method as recited in claim 2 wherein said decoupling capacitor includes a small decoupling capacitor having a capacitance value of about 5 pico-farad (pF).

4. The method as recited in claim 2 includes providing a series connected pair of field effect transistors coupled between the logic power supply rail and the virtual ground node and a current source connected to a virtual regulator reference.

5. The method as recited in claim 1 wherein providing a PLL circuit including a current mode logic (CML) inductor capacitor (LC) Voltage Controlled Oscillator (VCO) includes providing an LC tank resonator including an inductor and voltage-controlled capacitance varactors receiving the level shifted increment and decrement tuning signals through a respective resistor for tuning said CML LC VCO.

6. The method as recited in claim 5 includes said respective resistor and said voltage-controlled capacitance varactors providing said loop filter function.

7. A phase locked loop (PLL) circuit for implementing a compact current mode logic inductor capacitor voltage controlled oscillator for high speed communications comprising:
a current mode logic (CML) inductor capacitor (LC) Voltage Controlled Oscillator (VCO); said LC VCO including an inductor and voltage-controlled capacitance varactors;
a reference circuit generating a virtual ground node for biasing noise sensitive components, said virtual ground node tracking a logic power supply noise, incurring no jitter penalty;
a feedback frequency divider receiving a VCO oscillation signal from said CML LC VCO and providing a divided down feedback frequency signal to a phase detector;
a level shifter coupled to said phase detector including said virtual ground node providing level shifted VCO increment and decrement tuning values coupled by a respective resistor to said voltage-controlled capacitance varactors for tuning said voltage-controlled capacitance varactors of the LC VCO, and providing a loop filter function.

8. The phase locked loop (PLL) circuit as recited in claim 7 includes a calibration macro function calibrating a center frequency of said CML LC VCO at power on.

9. The phase locked loop (PLL) circuit as recited in claim 7 wherein said reference circuit generating the virtual ground node includes a decoupling capacitor connected between the virtual ground node and logic power supply rail.

10. The phase locked loop (PLL) circuit as recited in claim 9 wherein said decoupling capacitor includes a small decoupling capacitor having a capacitance value of about 5 picofarad (pF).

11. The phase locked loop (PLL) circuit as recited in claim 9 includes a series connected pair of field effect transistors coupled between the logic power supply rail and the virtual ground node, and a current source to a virtual regulator reference.

12. The phase locked loop (PLL) circuit as recited in claim 7 wherein said CML LC VCO includes an AC coupled level shifter receiving a VCO oscillation signal and providing a virtual ground node level shifted VCO frequency signal and a second level shifter shifting back to said VCO oscillation signal applied to said feedback frequency divider.

13. The phase locked loop (PLL) circuit as recited in claim 7 wherein said phase detector includes a quadrature XOR phase detector; said quadrature XOR phase detector outputs VCO increment and decrement tuning signals separated in phase by 90 degrees.

14. The phase locked loop (PLL) circuit as recited in claim 7 wherein said LC VCO includes a cross coupled differential pair of field effect transistors coupled between said inductor and voltage-controlled capacitance varactors and a current source.

15. A design structure embodied in a machine readable medium used in a design process, the design structure comprising:
a phase locked loop (PLL) circuit tangibly embodied in the machine readable medium used in the design process, said PLL circuit for implementing a compact current mode logic inductor capacitor voltage controlled oscillator for high speed communications, said PLL circuit comprising:
a current mode logic (CML) inductor capacitor (LC) Voltage Controlled Oscillator (VCO); said LC VCO including an inductor and voltage-controlled capacitance varactors;
a reference circuit generating a virtual ground node for biasing noise sensitive components, said virtual ground node tracking a logic power supply noise, incurring no jitter penalty;
a feedback frequency divider receiving a VCO oscillation signal from said CML LC VCO and providing a divided down feedback frequency signal to a phase detector;
a level shifter coupled to said phase detector including said virtual ground node providing level shifted VCO increment and decrement tuning values coupled by a respective resistor to said voltage-controlled capacitance varactors for tuning said voltage-controlled capacitance varactors of the LC VCO, and providing a loop filter function, wherein the design structure, when read and used in the manufacture of a semiconductor chip produces a chip comprising said PLL circuit.

16. The design structure of claim 15, wherein the design structure comprises a netlist, which describes said PLL circuit.

17. The design structure of claim 15, wherein the design structure resides on storage medium as a data format used for the exchange of layout data of integrated circuits.

18. The design structure of claim 15, wherein the design structure includes at least one of test data files, characterization data, verification data, or design specifications.

19. The design structure of claim 15, wherein said reference circuit generating the virtual ground node includes a decoupling capacitor connected between the virtual ground node and logic power supply rail, and a series connected pair of field effect transistors coupled between the logic power supply rail and the virtual ground node, and a current source connected to a virtual regulator reference.

20. The design structure of claim 15, wherein said LC VCO includes cross coupled differential pair of field effect transistors coupled between said inductor and said voltage-controlled capacitance varactors and a current source; and wherein said PLL circuit includes a calibration macro function calibrating a center frequency of said CML LC VCO at power on.

* * * * *